United States Patent [19]
Hisamune et al.

[11] Patent Number: 6,010,946
[45] Date of Patent: Jan. 4, 2000

[54] SEMICONDUCTOR DEVICE WITH ISOLATION INSULATING FILM TAPERED AND METHOD OF MANUFACTURING THE SAME

[75] Inventors: Yosiaki Hisamune; Kohji Kanamori, both of Tokyo, Japan

[73] Assignee: NEC Corporation, Tokyo, Japan

[21] Appl. No.: 08/914,169

[22] Filed: Aug. 19, 1997

[30] Foreign Application Priority Data

Aug. 21, 1996 [JP] Japan ..................... 8-220028
Aug. 8, 1997 [JP] Japan ..................... 9-214432

[51] Int. Cl.⁷ .............................. H06L 21/762
[52] U.S. Cl. ........................... 438/405; 438/713
[58] Field of Search ................... 438/405, 400, 438/404, 295, 257, 258, 275, 294, 39, 41, 164, 155, 165

[56] References Cited

U.S. PATENT DOCUMENTS

| 4,762,805 | 8/1988 | Cheung et al. | 437/63 |
| 5,534,456 | 7/1996 | Yuan et al. | 437/43 |
| 5,712,205 | 1/1998 | Park et al. | 438/425 |

FOREIGN PATENT DOCUMENTS

| 4-340767 | 11/1992 | Japan . |
| 4340767 | 11/1992 | Japan . |
| 8-55968 | 2/1996 | Japan . |

OTHER PUBLICATIONS

S. Wolf and R.N. Tuaber, Silicon Processing for the VLSI Era, vol. 1, Lattice Press, pp. 408 and 547–551, 1986.

*Primary Examiner*—Olik Chaudhuri
*Assistant Examiner*—Daniel H. Mao
*Attorney, Agent, or Firm*—Sughrue, Mion, Zinn, Macpeak & Seas, PLLC

[57] ABSTRACT

In a method of a semiconductor device, an insulating film on a semiconductor substrate is formed. Then, a first mask on the insulating film in a first region is formed and the insulating film is removed using the first mask for isolation insulating films in the first region. In this case, an element to be formed in the first region has a first active region. Also, a second mask is formed on the insulating film in a second region. The second mask is different from the first mask. The insulting film is removed using the second mask for isolation insulating films in the second region. In this case, a first element to be formed in the first region has a first active region narrower than a second active region of a second element to be formed in the second region. Generally, the insulating film in the first region is removed and then the insulating film in the second region is removed.

19 Claims, 21 Drawing Sheets

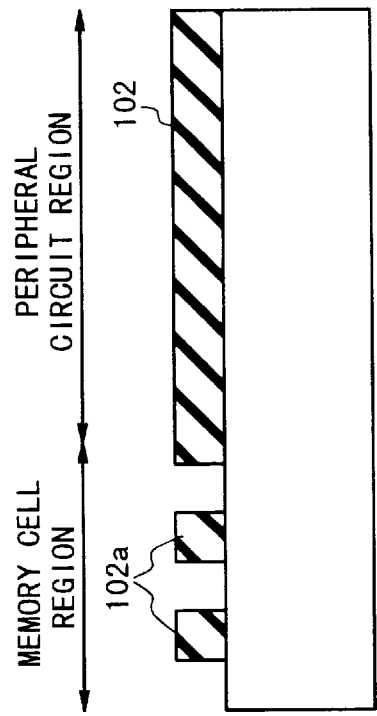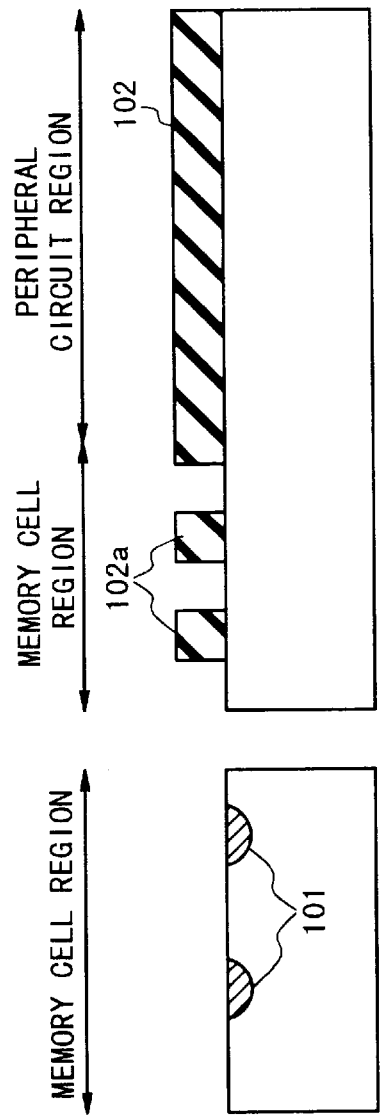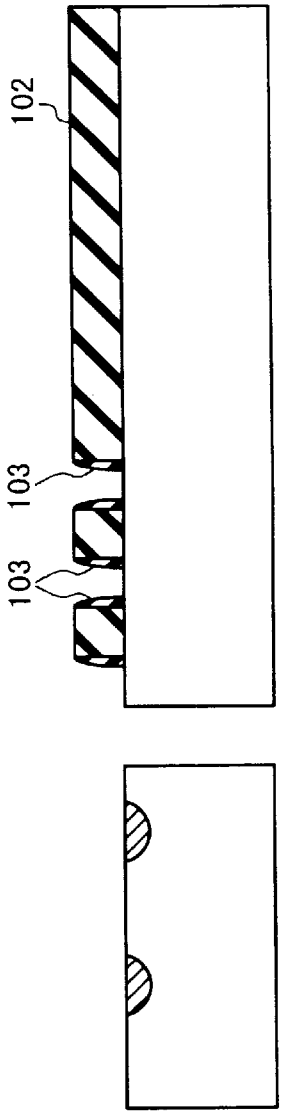

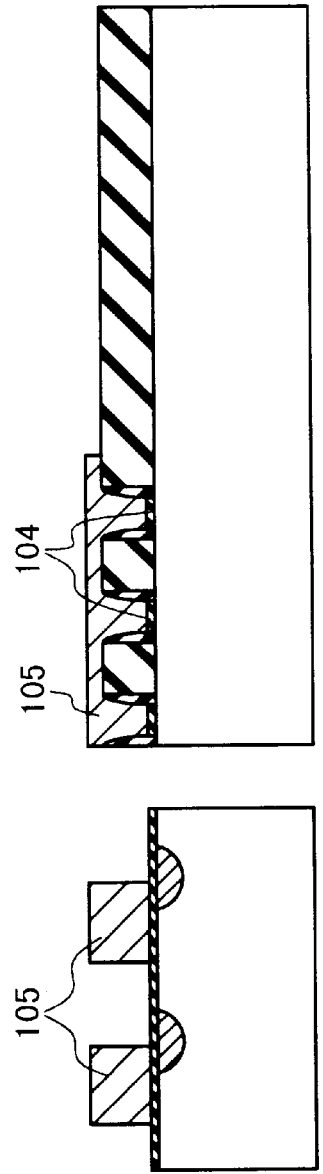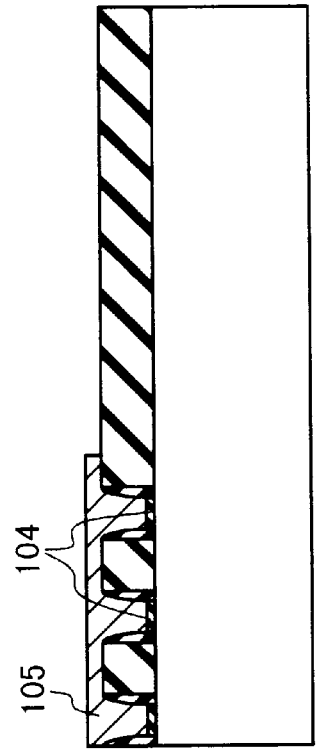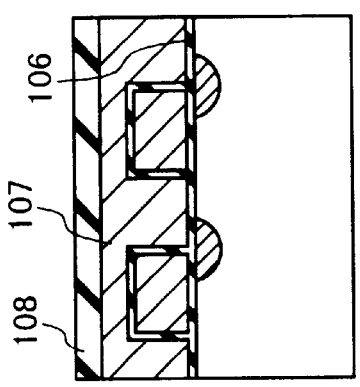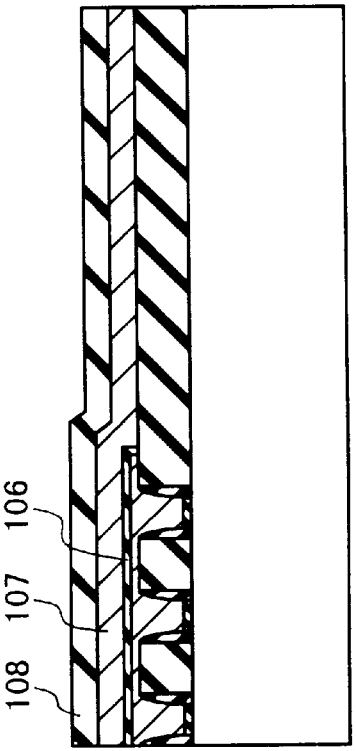

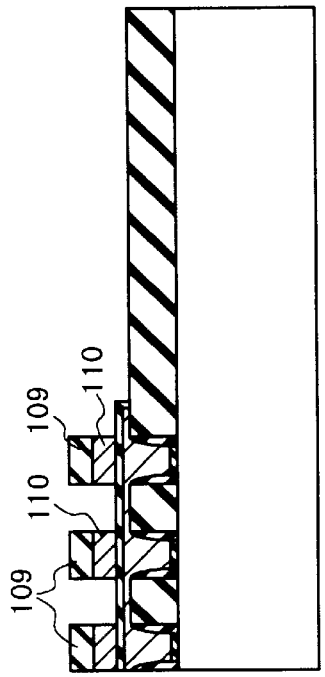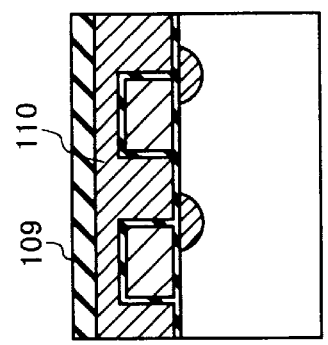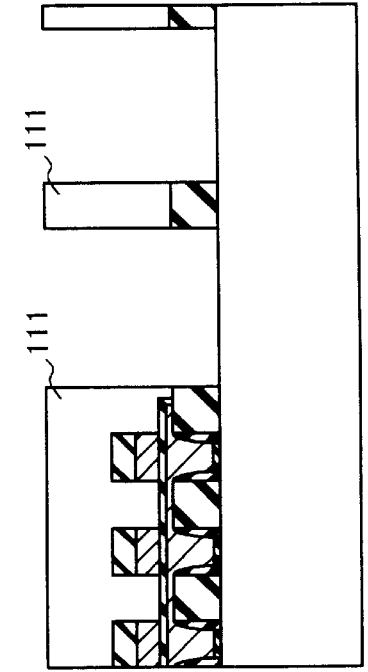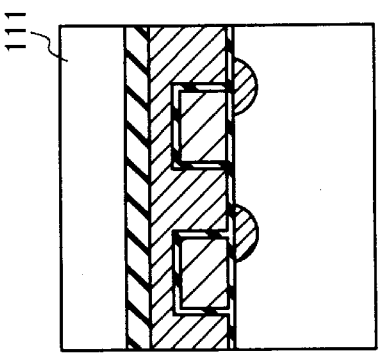

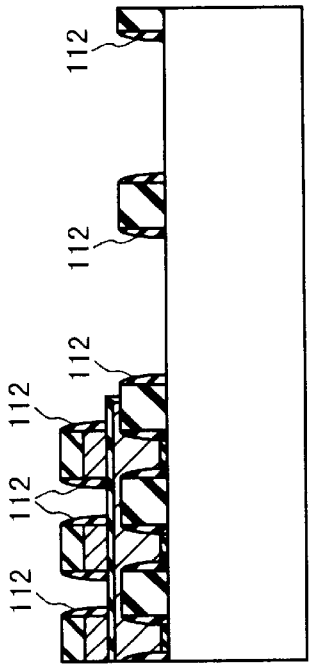
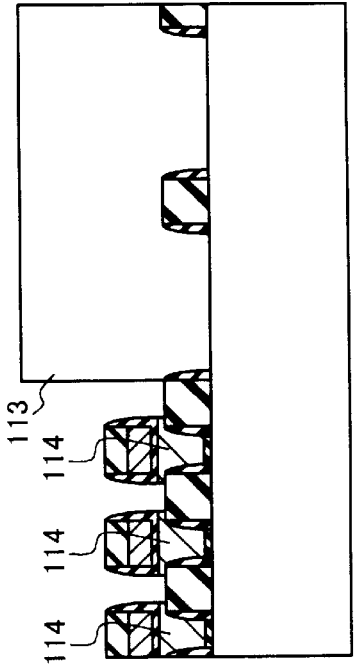

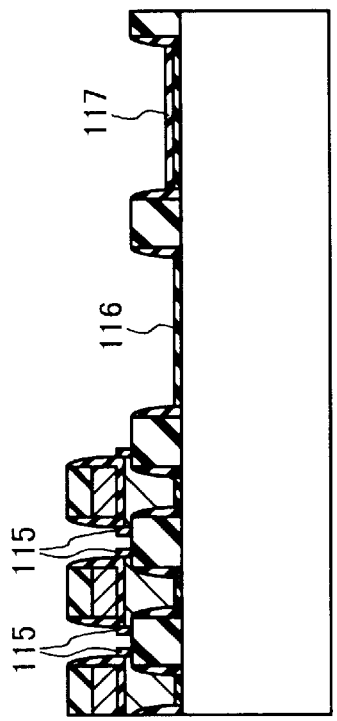
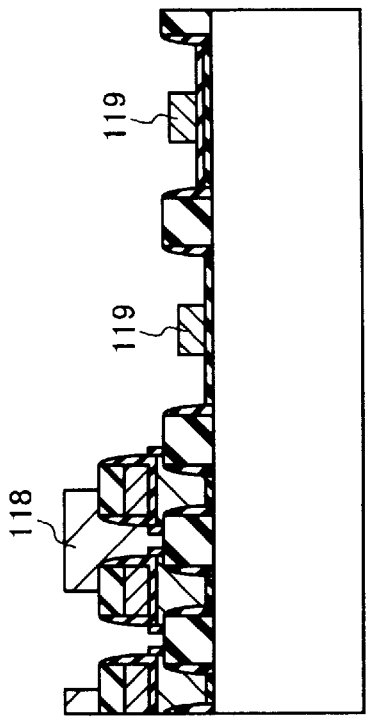
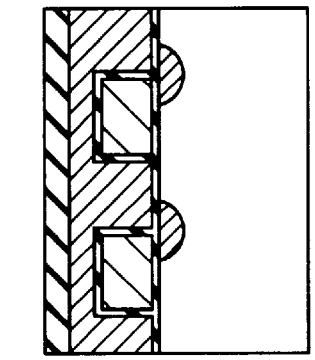
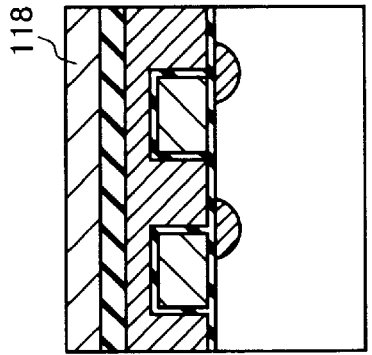

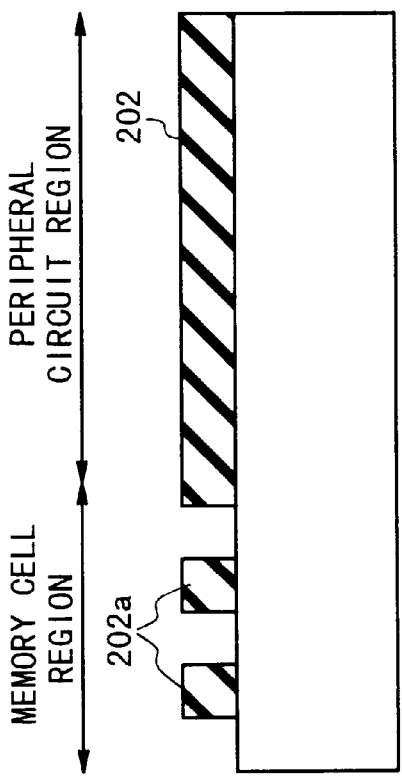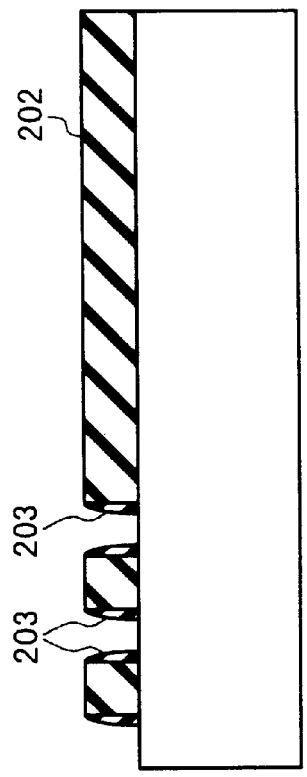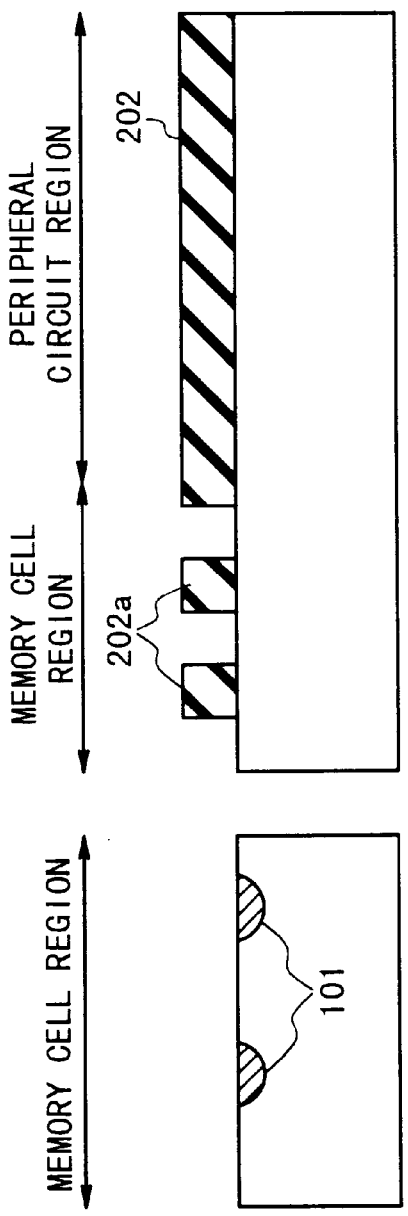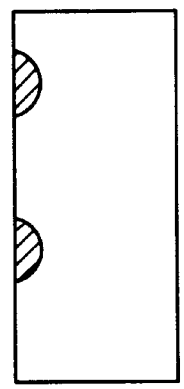

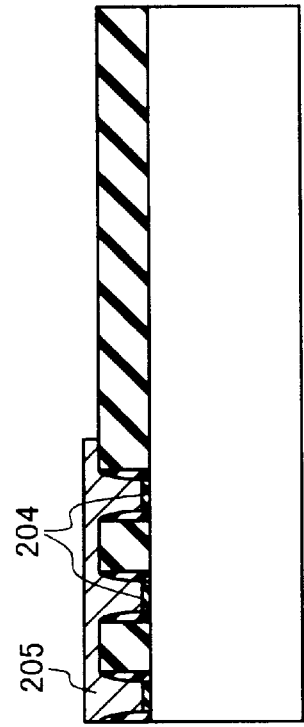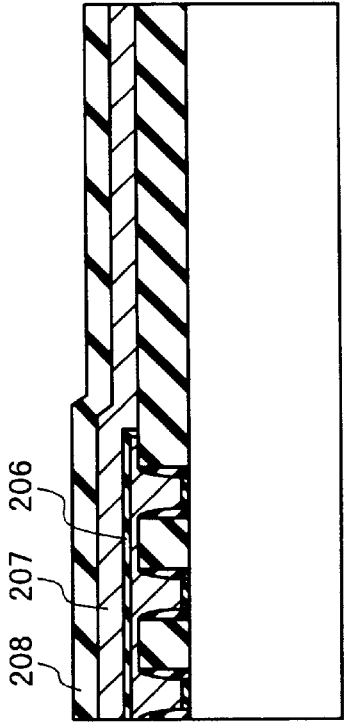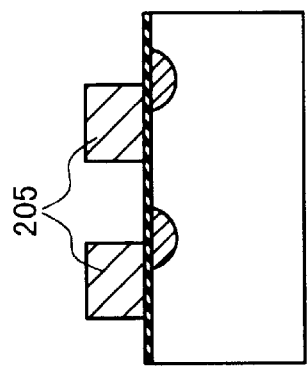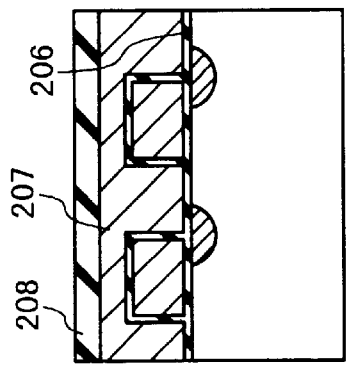

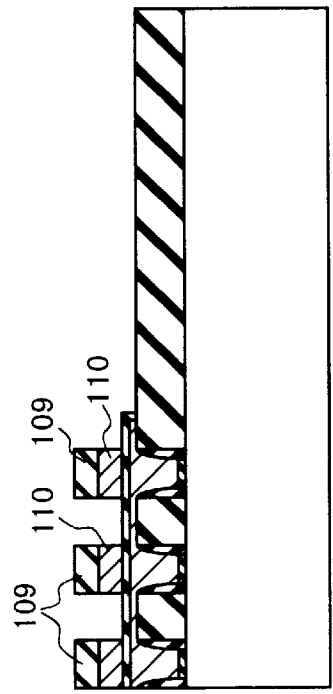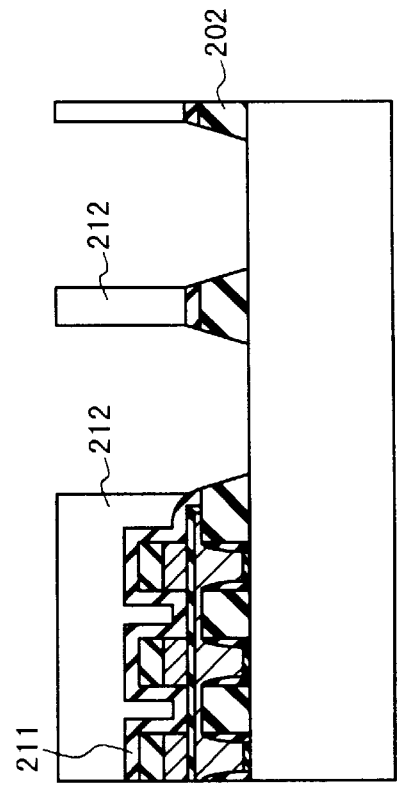

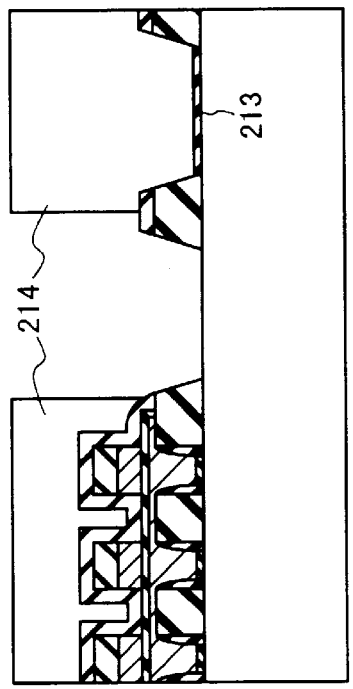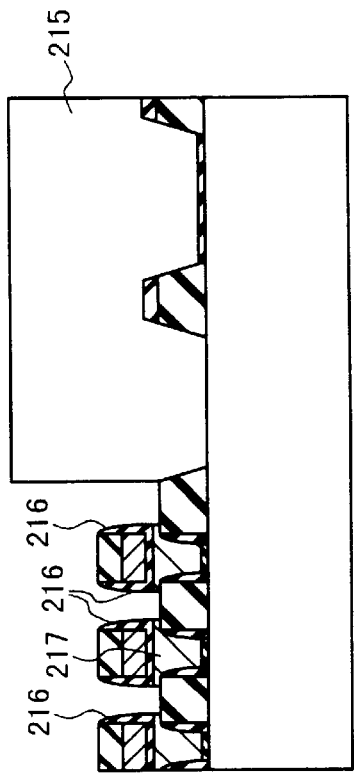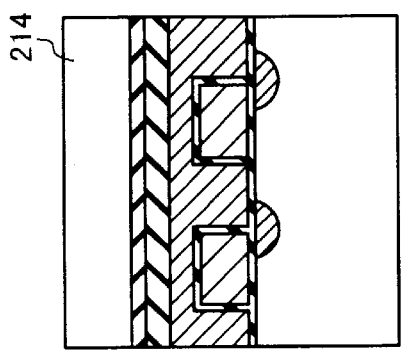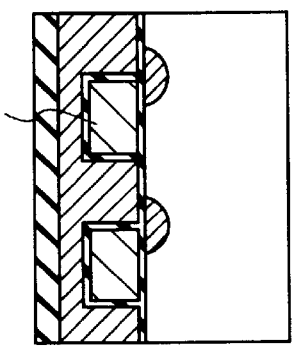

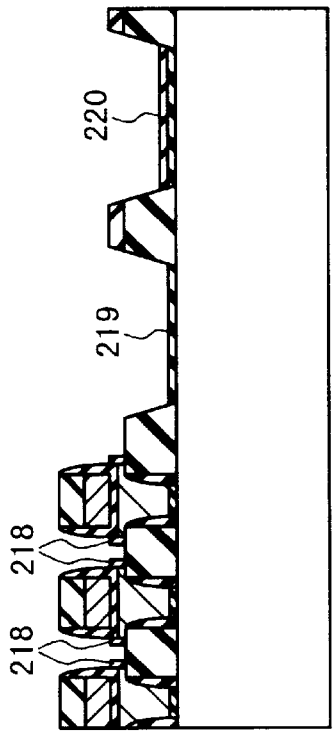
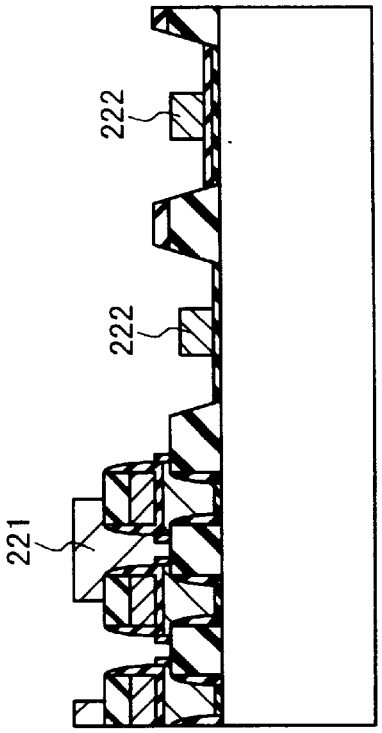

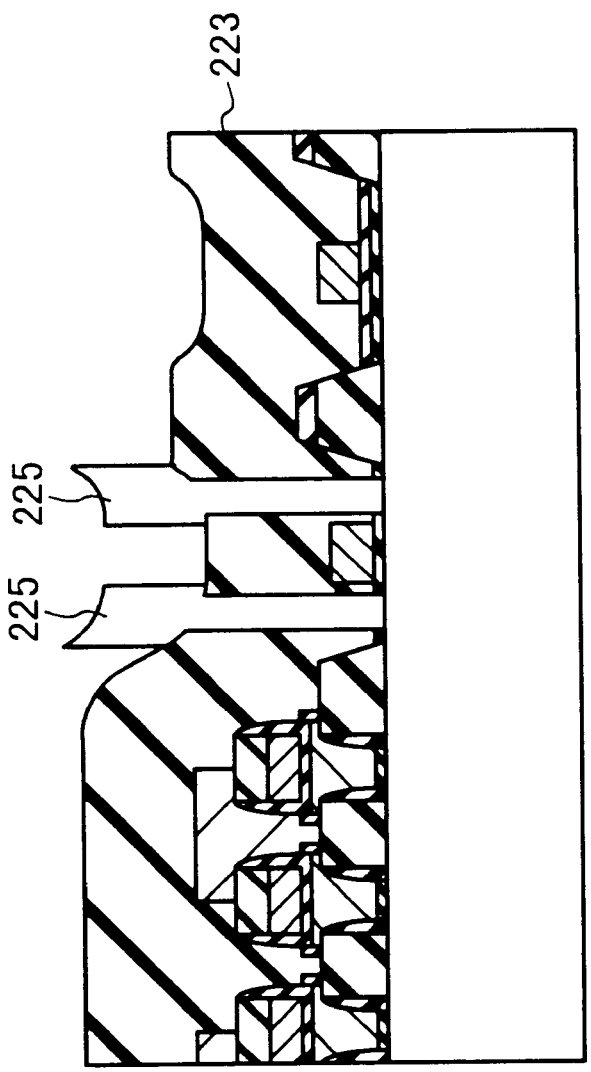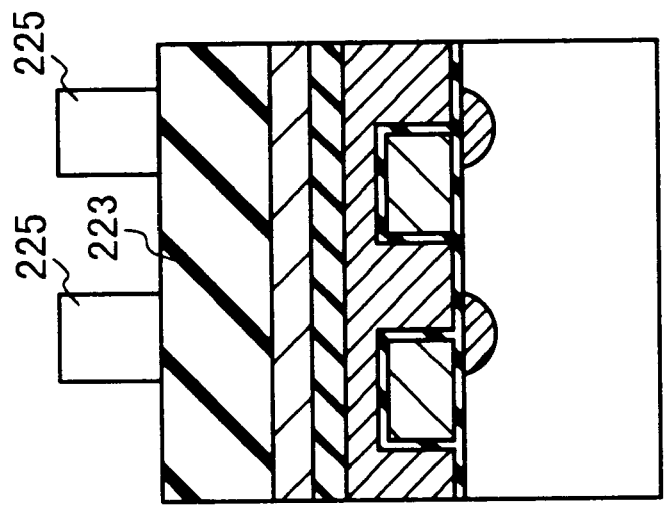

SEMICONDUCTOR DEVICE WITH ISOLATION INSULATING FILM TAPERED AND METHOD OF MANUFACTURING THE SAME

BACKGROUND OF THE INVENTION

1. Field of the Invention

The present invention relates to a semiconductor device and a manufacturing method for the same, and more particularly to a semiconductor device with an isolation insulating film tapered and a method of manufacturing the same.

2. Description of the Related Art

A semiconductor memory device has a group of storage elements or memory cells and a peripheral circuit, which are respectively arranged in a memory cell region and a peripheral circuit region on a chip. Also, the size of the semiconductor memory device is mainly dependent upon the size of the memory cell region. For this reason, it is generally designed in such a manner that the memory cells in the memory cell region have patterns finer than the peripheral circuit. In the semiconductor memory device such as a DRAM, an SRAM and a flash EEPROM, high integration is attempted more increasingly in recent years, so that the memory cell is manufactured to have a smaller size.

In such a semiconductor memory device, in order to correctly operate memory cell elements and peripheral circuit elements, an insulating film for physically and electrically separating the neighbor elements from each other is required. Accordingly, the forming technique of such an insulating film is important. The region for separating between the elements is referred to as an isolation region, and the insulating film formed in the isolation region is referred to as an isolation insulating film.

Such an isolation insulating film of a semiconductor memory device is generally formed by a local oxidation of silicon (LOCOS) method. That is, a silicon oxide film having the film thickness of about 50 nm and a silicon nitride film having the film thickness of about 100 to 400 nm are laminated in this order on the surface of a semiconductor substrate. Then, the silicon nitride film on the isolation region is removed using a photo-lithography method and a dry etching method. After that, thermal oxidation is performed to form a silicon oxide film (a field oxide film) as an isolation insulating film in the isolation region.

However, in the LOCOS method, a phenomenon called bird beak occurs in which the isolation insulating film rips into an active region in the boundary between the isolation region and the active region. This obstructs fine formation of a pattern of an element.

A new isolation method is proposed in Japanese Laid Open Patent Disclosure (JP-A-Heisei 4-340767) to solve the above problem. In the new isolation method suitable for the fine formation of a pattern, first, a silicon oxide film of a uniform film thickness is formed on the surface of a silicon substrate. Then, the silicon oxide film on an active region is patterned and removed by a photo-lithography method and a dry etching method. Thus, the isolation insulating film is formed.

The method of manufacturing the isolation insulating film will be described in detail with reference to FIGS. 1A to 1E.

As shown in FIG. 1A, a silicon oxide film layer 901 of a uniform film thickness is first formed by a chemical vapor deposition (CVD) method or a thermal oxidation method on the surface of a silicon substrate 900.

Next, as shown in FIG. 1B, a photo-resist layer is patterned on the isolation region using the photo-lithography method to form a photo-resist pattern 902. Subsequently, the silicon oxide film layer 901 on the active region is removed by the dry etching method using the photo-resist pattern 902 as a mask to produce silicon oxide film patterns 901a.

Next, as shown in FIG. 1C, the photo-resist pattern 902 is peeled off.

Next, as shown in FIG. 1D, a silicon oxide film layer 903 having good coverage is grown on the surface of the substrate, using a low-pressure chemical vapor deposition (LP-CVD) method. As a result, a separation of adjacent silicon oxide film patterns 901a is narrowed smaller than a separation determined based on the lithography method to form an element having fine patterns. Thus, the speeding-up of a circuit is realized.

Next, as shown in FIG. 1E, the silicon oxide film layer 903 is etched back by an anisotropic dry etching method to form side wall insulating films 904 on the side walls of each of the silicon oxide film patterns 901a.

In this way, an element having fine patterns can be formed between the isolation films without any bird beak.

However, when a memory cell element and a peripheral circuit element are formed after the isolation oxide films are formed using the method shown in FIGS. 1A to 1E, the following problem occurs. The problem will be described below with reference to FIGS. 2A to 2D.

As shown in FIG. 2A, the silicon oxide films 1001 with the side wall insulating films 1002 are formed on the silicon substrate 1000 as the isolation insulating films, in the same processes as in FIGS. 1A to 1E.

Next, as shown in FIG. 2B, after a gate oxide film layer 1003 is formed using a thermal oxidation method, a polysilicon layer 1004 is deposited on the surface of the substrate, and then phosphorus ions are implanted.

Further, as shown in FIG. 2C, after a silicon oxide film layer 1005 is formed by a thermal oxidation method, a polysilicon layer 1006 is deposited, and then phosphorus ions are implanted.

Next, as shown in FIG. 2D, the polysilicon layer 1006 is etched to form a control gate 1007. At this time, because there are steep steps in the peripheral circuit region due to the isolation insulating film, the difference in film thickness of the polysilicon film 1006 is between a top flat section and a bottom section. Even if the etching is supposed to be uniformly performed in the state, polysilicon films 1008 would have been left on the side walls of the steps. In this case, since the polysilicon layer 1004 completely fills between the isolation insulating films in the memory cell region to have a flat surface. Therefore, the above etching remainder is not left.

This etching remainder acts as a mask when the oxide film layer 1005 is etched in the subsequent processes to this step. If the polysilicon layer 1004 is etched in this state, the more etching remainder is left in the step portion. The etching remainder causes particles and the production yield decreases. For this reason, if an over-etching is performed to remove the etching remainder, there is the possibility that the lower layer is damaged. There causes a problem in electrical leak and a formation of a short-circuit, resulting in decrease of the production yield.

Also, a gate electrode of 2-layer or 3-layer polysilicon film is generally used in the memory cell region. Therefore, the step between the memory cell region and the peripheral circuit region is large. For this reason, there is a problem in that a manufacture margin in the lithography process and the etching process on the manufacturing way is narrow, resulting in decrease of the production yield.

SUMMARY OF THE INVENTION

The present invention is made in the light of the above circumstances. An object of the present invention is to provide a semiconductor device and a method of manufacturing the same in which isolation insulating films can be separately formed in the memory cell region and the peripheral circuit region.

Another object of the present invention is to provide a semiconductor device and a method of manufacturing the same in which an isolation insulating film can be formed more severe in the memory cell.

Still another object of the present invention is to provide a semiconductor device and a method of manufacturing the same in which isolation insulating films have taper sections without influence of the design size.

In order to achieve an aspect of the present invention, a method of a semiconductor device, includes the steps of:

forming an insulating film on a semiconductor substrate;

performing a first formation of a first mask on the insulating film in a first region;

performing a first removal of the insulating film using the first mask for isolation insulating films in the first region, wherein an element to be formed in the first region has a first active region;

performing a second formation of a second mask on the insulating film in a second region, the second mask being different from the first mask; and performing a second removal of the insulating film using the second mask for isolation insulating films in the second region, wherein a first element to be formed in the first region has a first active region narrower than a second active region of a second element to be formed in the second region. The step of performing a second removal is desirably performed after the step of performing a first removal.

The step of performing a first removal are performed using a dry etching method. In this case, a mixture gas of at least two of $CF_4$, $CHF_3$, $CH_2F_2$, $C_4F_8$, CO, $SF_6$ and Ar may be used as an etching gas. Also, etching conditions such as a pressure, a mixture gas flow rate, a mixture ratio of the at least two gases, and a plasma generation voltage are optimally adjusted in the step of performing a first removal and the step of performing a second removal, respectively. For example, the pressure in the step of performing a first removal is lower than that in the step of performing a second removal.

In addition, the step of performing a first removal includes forming the isolation insulating films in the first region to have a taper of a first angle range. In this case, the step of performing a second removal includes forming the isolation insulating films in the second region to have a taper of a second angle range which is smaller than the first angle range. The first angle range may be 80 to 90 degrees and the second angle range may be 60 to 80 degrees.

Further, the isolation insulating films in the second region are higher than the isolation insulating films in the first region. In this case, the method may further include the step of forming another insulating film on the insulating film before the step of performing a second removal. The step of forming another insulating film is formed during a formation of the first element.

In order to achieve another aspect of the present invention, a method of a semiconductor device, includes the steps of:

forming an insulating film on a semiconductor substrate;

forming isolation insulating films in first and second regions from the insulating film such that the isolation insulating film in the first region has a taper portion of a first angle steeper than a second angle of a taper portion of the isolation insulating film in the second region, wherein a first element to be formed in the first region has a first active region narrower than a second active region of a second element to be formed in the second region;

forming the first element between the isolation insulating films in the first region; and forming the second element between the isolation insulating films in the second region.

In order to achieve still another aspect of the present invention, a semiconductor device, includes isolation insulating films in first and second regions on a semiconductor substrate such that the isolation insulating film in the first region has a taper portion of a first angle steeper than a second angle of a taper portion of the isolation insulating film in the second region, a first element formed between the isolation insulating films in the first region on the semiconductor substrate, and a second element between the isolation insulating films in the second region on the semiconductor substrate, wherein the first element has a first active region narrower than a second active region of the second element.

BRIEF DESCRIPTION OF THE DRAWINGS

FIGS. 3A-1 and 3A-2 to 3J-1 and 3J-2 are cross sectional views illustrating a method of manufacturing a semiconductor device according to a first embodiment of the present invention;

FIGS. 4A-1 and 4A-2 to 4K-1 and 4K-2 are cross sectional views illustrating a method of manufacturing according to a second embodiment of the present invention;

DESCRIPTION OF THE PREFERRED EMBODIMENTS

Figure 1A:
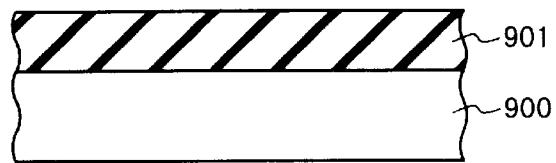
FIGS. 1A to 1E are cross sectional views illustrating a first conventional method of manufacturing an isolation film.
Figure 1B:
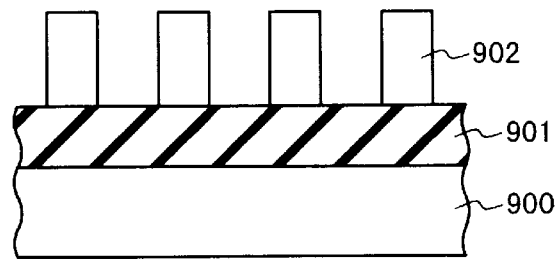
Figure 1C:
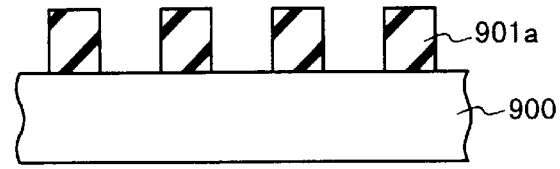
Figure 1D:
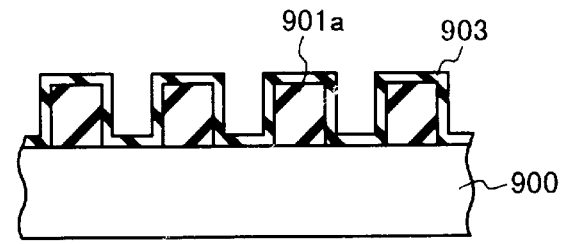
Figure 1E:
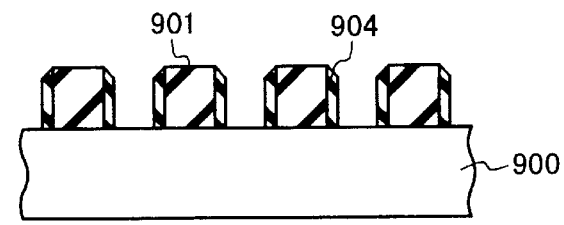
Figure 2A:
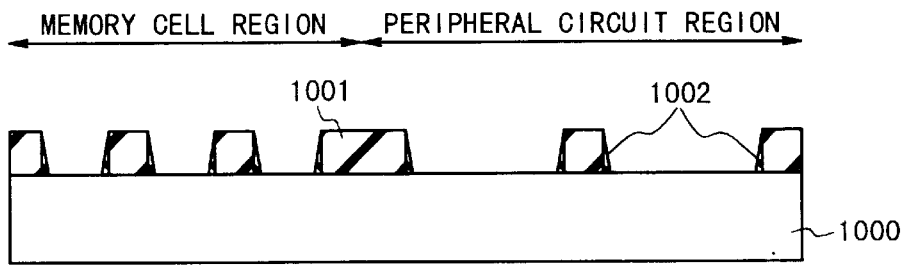
FIGS. 2A to 2D are cross sectional views illustrating a second conventional method.
Figure 2B:
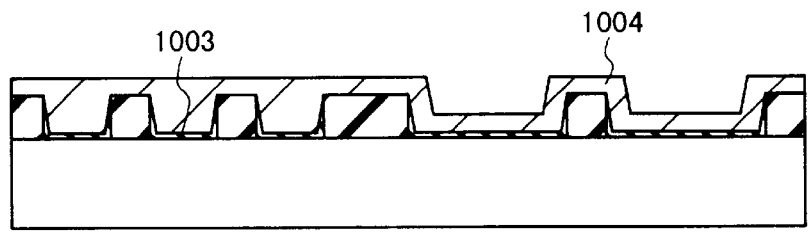
Figure 2C:
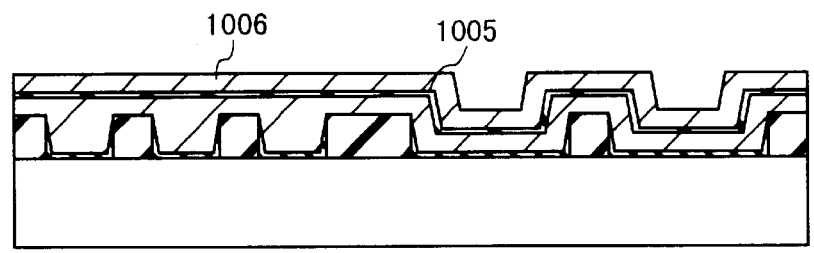
Figure 2D:
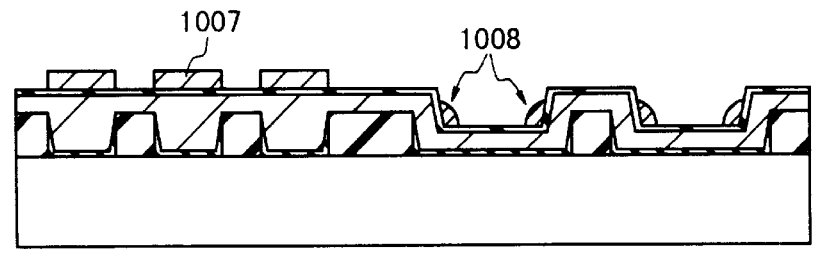

Next, a semiconductor device of the present invention will be described below in detail with reference to the accompanying drawings.

FIGS. 3A-1 and 3A-2 to 3J-1 and 3J-2 are cross sectional views illustrating a method of manufacturing a semiconductor device according to a first embodiment of the present invention. In these figures, FIGS. 3A-1, 3B-1 to 3J-1 are cross sectional views in a direction to cross a source and a drain of a memory cell of the semiconductor device. Also, FIGS. 3A-2, 3B-2 to 3J-2 are cross sectional views in a direction along the source or the drain of the memory cell of the semiconductor device.

First, as shown in FIGS. 3A-1 and 3A-2, n-type impurity diffusion layers 101 are formed as a source and a drain of a memory cell in a memory cell region. Then, a silicon oxide film layer 102 is formed on the surface of a semiconductor substrate by a CVD method to have the film thickness of 1000 to 4000 μm. Subsequently, the silicon oxide film layer 102 in the memory cell region is first patterned to form isolation oxide films 102a.

Next, as shown in FIGS. 3B-1 and 3B-2, a silicon oxide film layer is deposited by a CVD method to have the film thickness smaller than a half of a separation between the adjacent isolation oxide films 102a in the memory cell region. Then, the deposited silicon oxide film is etched back by an anisotropic etching method. As a result, side wall oxide films 103 are formed on the side walls of each of the isolation insulating films 102a and the silicon oxide film layer 102 in a peripheral circuit region.

Next, as shown in FIGS. 3C-1 and 3C-2, after a gate oxide film 104 of each of memory cells is formed, a polysilicon film layer having phosphorus ions doped is deposited by the CVD method such that the isolation oxide films are embedded by the polysilicon film layer. Thereafter, the polysilicon film layer is patterned to form polysilicon films 105. At this time, since the peripheral circuit region is covered with the silicon oxide film layer 102, it is not necessary to be anxious for any substrate damage and any etching remainder in the peripheral circuit region.

Next, as shown in FIGS. 3D-1 and 3D-2, after a silicon oxide film 106 is formed by a thermal oxidation method, a polysilicon film layer 107 is deposited by a CVD method and then phosphorus ions are implanted. Further, a silicon oxide film layer 108 is formed by a thermal oxidation method or a CVD method.

Next, as shown in FIGS. 3E-1 and 3E-2, the silicon oxide film layer 108 is patterned to form oxide film masks 109. Subsequently, the polysilicon film 107 is etched, using the oxide film masks 109. As a result, control gates 110 are formed.

Next, as shown in FIGS. 3F-1 and 3F-2, the memory cell region and isolation regions in the peripheral circuit region is covered by a photo-resist pattern 111. Then, the silicon oxide film layer 102 in the peripheral circuit region is etched using the photo-resist pattern 111 as a mask.

Next, as shown in FIGS. 3G-1 and 3G-2, after the photo-resist pattern 111 is removed, a silicon oxide film is deposited by the CVD method on the surface of the substrate. The deposited silicon oxide film is etched back. As a result, side wall oxide films 112 are formed on the side walls of each of the isolation oxide films in the peripheral circuit region and the control gates.

Next, as shown in FIGS. 3H-1 and 3H-2, the peripheral circuit region is covered by a photo-resist pattern 113. The polysilicon film layer 105 is etched, using oxide films 109 and side wall oxide films 112 as a mask, to separate a floating gate 114 of each memory cell.

Next, as shown in FIGS. 3I-1 and 3I-2, tunnel oxide films 115, a gate oxide film 116 for a peripheral circuit element and a gate oxide film 117 of a transistor of a high breakdown voltage are formed by a thermal oxidation method, a CVD method, or a combination of them.

Next, as shown in FIGS. 3J-1 and 3J-2, a polysilicon film is deposited and patterned to form erase gates 118 and peripheral circuit element gates 119.

Figure 7:
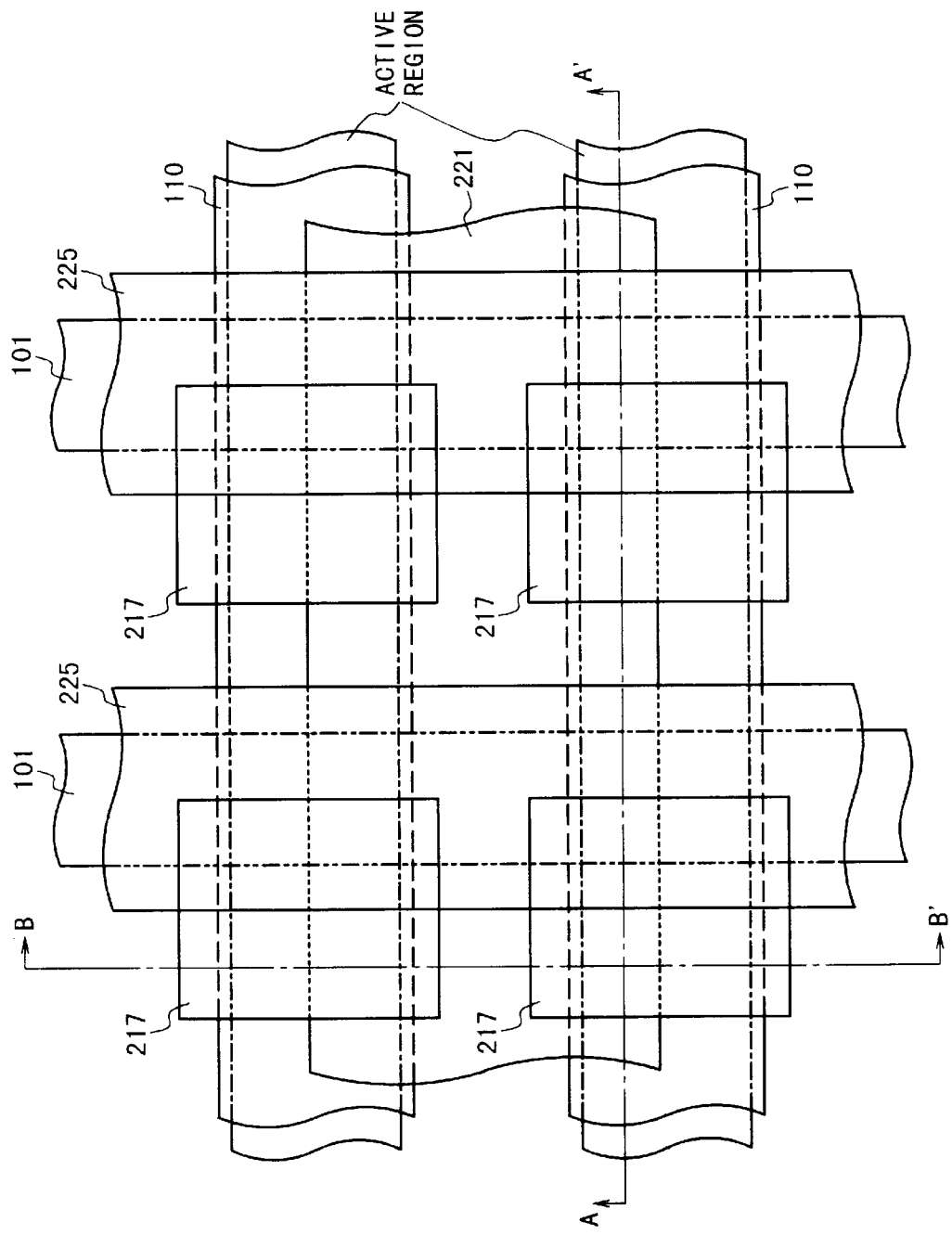
FIG. 7 is a plan view illustrating a semiconductor device according to the second embodiment of the present invention.

Next, a method of manufacturing a semiconductor device according to the second embodiment of the present invention will be described below in detail with reference to FIGS. 4A-1 and 4A-2 to 4K-1 and 4K-2. FIGS. 4A-1 and 4A-2 to 4K-1 and 4K-2 are cross sectional views illustrating a method of manufacturing according to a second embodiment of the present invention. In these figures, FIGS. 4A-1, 4B-1 to 4K-1 are cross sectional views in a direction to cross a source and a drain of a memory cell of the semiconductor device, i.e., when the semiconductor device is cut along the line A–A' in the plan view shown in FIG. 7. Also, FIGS. 4A-2, 4B-2 to 4K-2 are cross sectional views in a direction along the source or the drain of the memory cell of the semiconductor device, i.e., when the semiconductor device is cut along the line B–B' in the plan view shown in FIG. 7.

Figure 8:
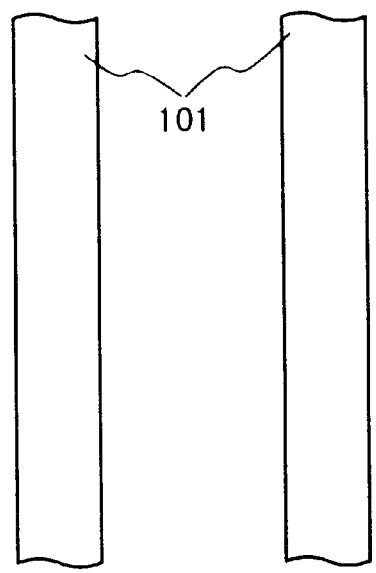
FIGS. 8 to 13 are plan views illustrating a method of manufacturing a semiconductor device according to the second embodiment of the present invention.

First, as shown in FIGS. 4A-1 and 4A-2, n-type impurity diffusion layers 101 as source and drain regions of a memory cell are formed. That is, a photo-resist layer is formed on a silicon substrate in which P-type impurity is doped. Then, the photo-resist layer is patterned in a parallel stripe manner for a mask, as shown in FIG. 8. Using this mask, arsenic ions are implanted with the implantation energy of 50 KeV and the implantation dose of $5 \times 10^{15}$ cm$^{-2}$. After that, heat treatment is performed at the temperature of 900° C. for 30 minutes to form the embedded diffusion layers 101, as in the first embodiment. The embedded diffusion layers 101 are a source and a drain of each memory cell transistor and one of the diffusion layers 101 functions as a bit line.

Figure 9:
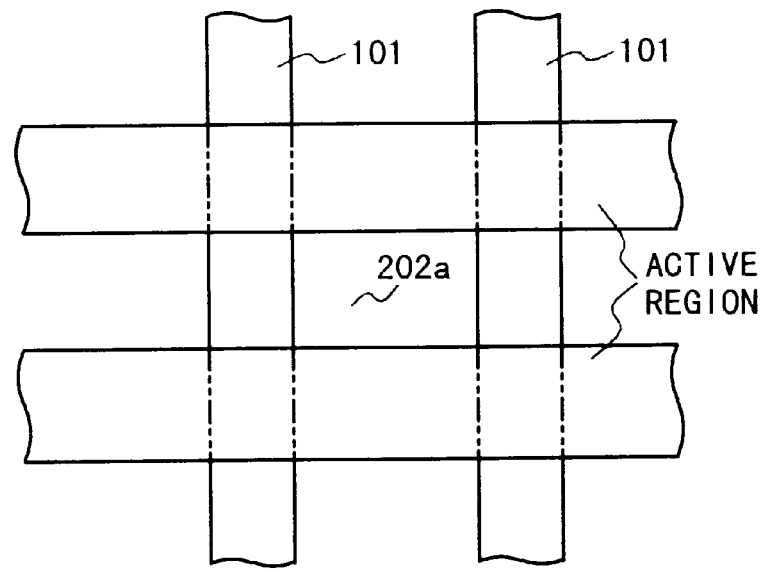

Then, a silicon oxide film layer 202 is deposited by a low-pressure CVD method on the surface of a semiconductor substrate to have the film thickness of 300 nm. Thereafter, only the deposited silicon oxide film layer in a memory cell region is first patterned to form isolation oxide films 202a, as shown in FIG. 9, like the first embodiment.

Next, as shown in FIGS. 4B-1 and 4B-2, a silicon oxide film is deposited by a low-pressure CVD method to have the film thickness smaller than a half of the width of a ditch between the isolation oxide films 202, e.g., of 100 nm in the memory cell region. Subsequently, the deposited silicon oxide film is etched back by an anisotropic etching method. By this, side wall oxide films 203 are formed on the side walls of each of the silicon oxide films 202a in the memory cell region and the silicon oxide film layer 202 in the peripheral circuit region.

Figure 10:
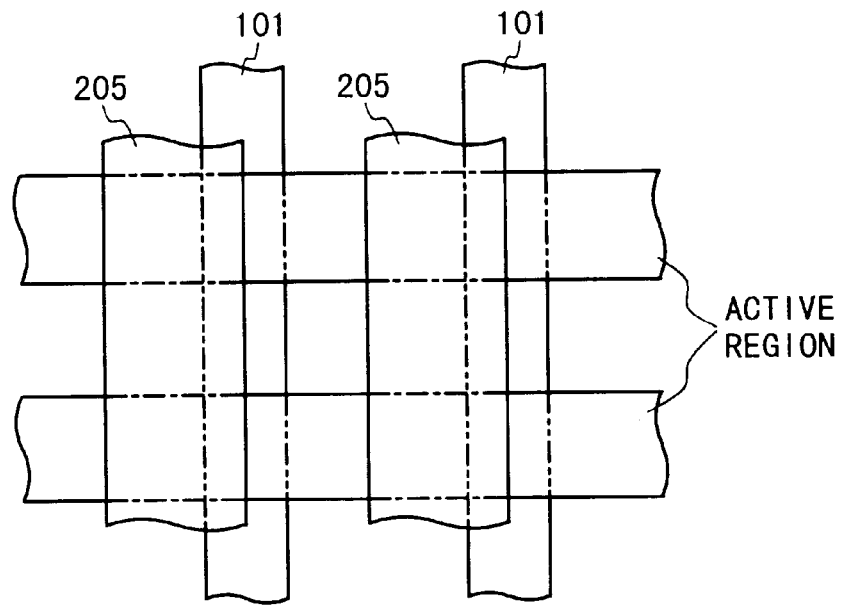

Next, as shown in FIGS. 4C-1 and 4C-2, a gate oxide films 204 of each of memory cells is formed to have the film thickness of 20 nm by heat treatment. Subsequently, a polysilicon film layer having phosphorus ions doped and having the film thickness of 200 nm is deposited by a CVD method to fill the ditches and to cover the isolation oxide films 202a. Then, the deposited polysilicon film layer is patterned to produce polysilicon films 205, as shown in FIG. 10, like the first embodiment. As a result, the polysilicon films 205 are patterned in a column direction for the floating gates.

Next, as shown in FIGS. 4D-1 and 4D-2, the silicon oxide films 204 on a region of the silicon substrate surface which are defined by the silicon oxide films 202a are completely removed. After that, a silicon oxide film 206 is formed on the polysilicon film 205 for elements in the memory cell regions by a low-pressure CVD method and a thermal oxidation method. Subsequently, a polysilicon film layer 207 of the film thickness of 250 nm is deposited in the memory cell region and the peripheral circuit region on the substrate by a low-pressure CVD method. Then, the phosphorus ions are implanted. Further, a silicon oxide film layer 208 of the film thickness of 200 nm is formed in the memory cell region and the peripheral circuit region on the substrate by a thermal oxidation method or a CVD method.

Figure 11:
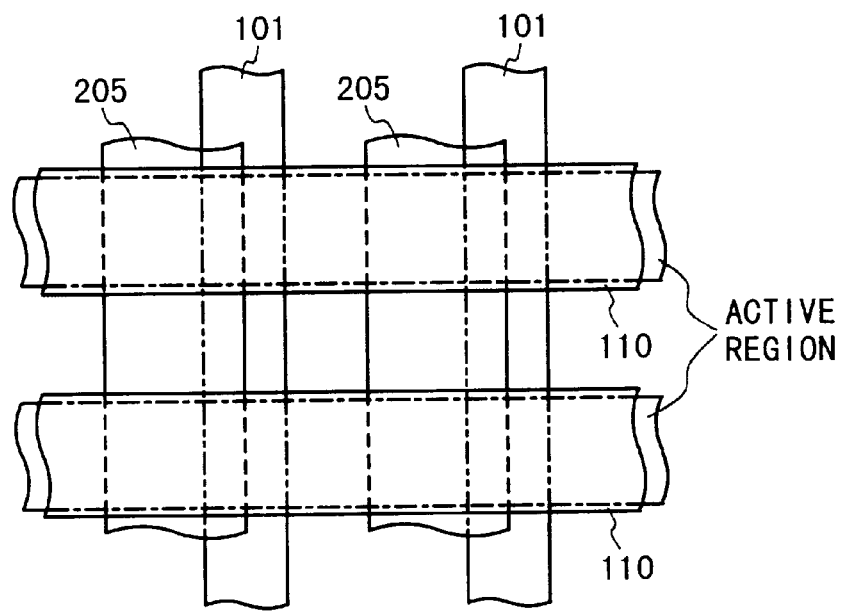

Next, as shown in FIG. 4E-1 and 4E-2, a photo-resist layer is formed and patterned in the form of parallel stripes perpendicular to the bit line. Subsequently, using the photo-resist pattern, the silicon oxide film layer 208 is patterned to form oxide film masks 209 in the memory cell region. The polysilicon film layer 207 is etched in a self-alignment manner with the patterned silicon oxide film, using the oxide film masks 209. By this, word lines and control gates 210 of the memory cells are formed in the memory cell region, as shown in FIG. 11, like the first embodiment.

Next, as shown in FIGS. 4F-1 and 4F-2, a silicon oxide film layer 211 having the film thickness of 100 nm is deposited in the memory cell region and the peripheral circuit region on the substrate by a CVD method. Subsequently, the memory cell region and isolation regions in the peripheral circuit region are covered by a photo-resist pattern 212. Then, the silicon oxide film layers 211 and 202 are etched using the photo-resist pattern 212 as a mask.

At this time, the isolation region in the peripheral circuit region is higher than the isolation region in the memory cell region because of the silicon oxide film layer 211.

Also, a plasma ambience of a mixture gas of, for example, carbon tetra-fluoride ($CF_4$) and carbon hydride tri-fluoride ($CHF_3$) is used for the etching of the silicon oxide film. As a result, the etching is performed such that the silicon oxide film 202a in the peripheral circuit regions has a section shape of a normal taper.

Next, as shown in FIGS. 4G-1 and 4G-2, gate oxide films 213 are formed in the peripheral circuit region by a thermal oxidation method or a CVD method. Subsequently, a photo-resist layer pattern 214 is provided to cover the memory cell region and the peripheral circuit region except a region for a normal transistor in the peripheral circuit region. The silicon oxide film 213 for the normal transistor is etched and removed. Then, the photo-resist layer 214 is removed.

Next, as shown in FIGS. 4H-1 and 4H-2, the peripheral circuit region is covered by a photo-resist layer 215, and then the silicon oxide film layer 211 in the memory cell region is etched back. Subsequently, after side wall oxide films 216 are formed on the side walls of each of the control gates. Then, the polysilicon film 205 is etched in a self-alignment manner, using the silicon oxide films 216 and 209 for a mask, to separate a floating gate 217 of each memory cell in the direction along the word line.

Next, as shown in FIGS. 4I-1 and 4I-2, tunnel oxide films 218, a gate oxide film 219 for the normal transistor and a gate oxide film 220 of the high breakdown voltage transistor are formed by a thermal oxidation method or a CVD method, or a combination of them.

Figure 12:
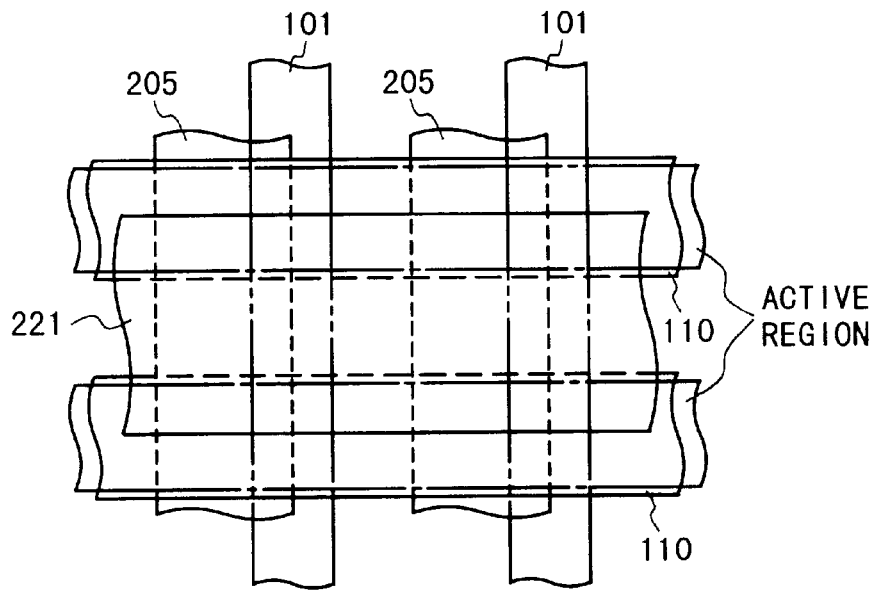

Next, as shown in FIGS. 4J-1 and 4J-2, a polysilicon film layer is deposited. Subsequently, a photo-resist layer is formed and patterned to have a pattern parallel to the word line for every two word lines. Then, the polysilicon film layer is patterned by an etching method using the patterned photo-resist as a mask, to form an erase gate 221 on the memory cells and gates 222 of the peripheral circuits elements, as shown in FIG. 12, like the first embodiment.

Figure 13:
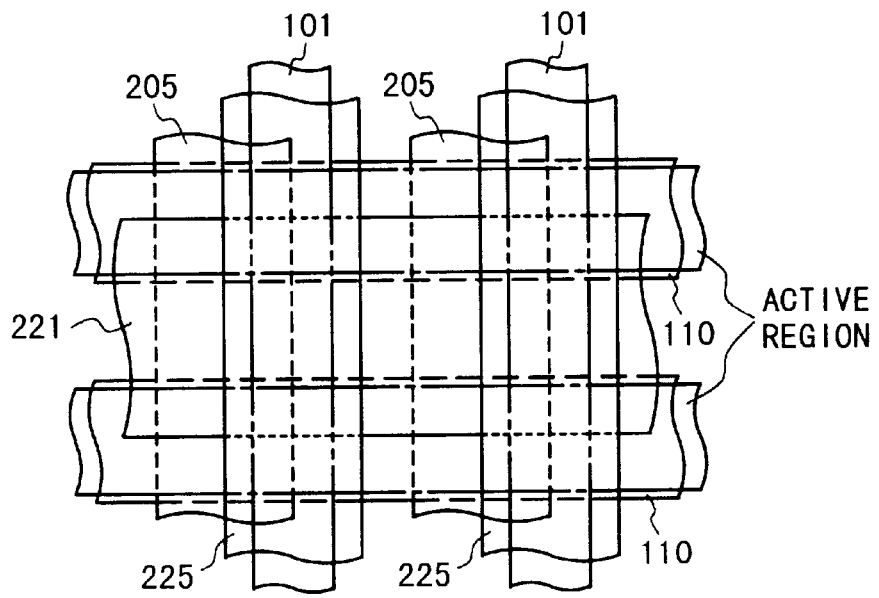

Next, as shown in FIGS. 4K-1 and 4K-2, source and drain regions of each of transistors of the peripheral circuit region are formed. Then, an interlayer insulating film 223 is deposited on the whole surface. After that, contact holes to the diffusion layer and the gate electrodes are formed by using a usual manufacturing method of a flash EEPROM. Then, metal wirings of aluminium are formed, as shown in FIG. 13. In this manner, the flash EEPROM is completed.

In the second embodiment, since the isolation insulating films in the peripheral circuit region are formed to have the film thickness thicker than that of the memory cell region, they can be formed to have a large bottom portion, resulting in decrease of a step. Also, the margin in the subsequent lithography process and etching process can be made wide.

Figures 5A, 5B:
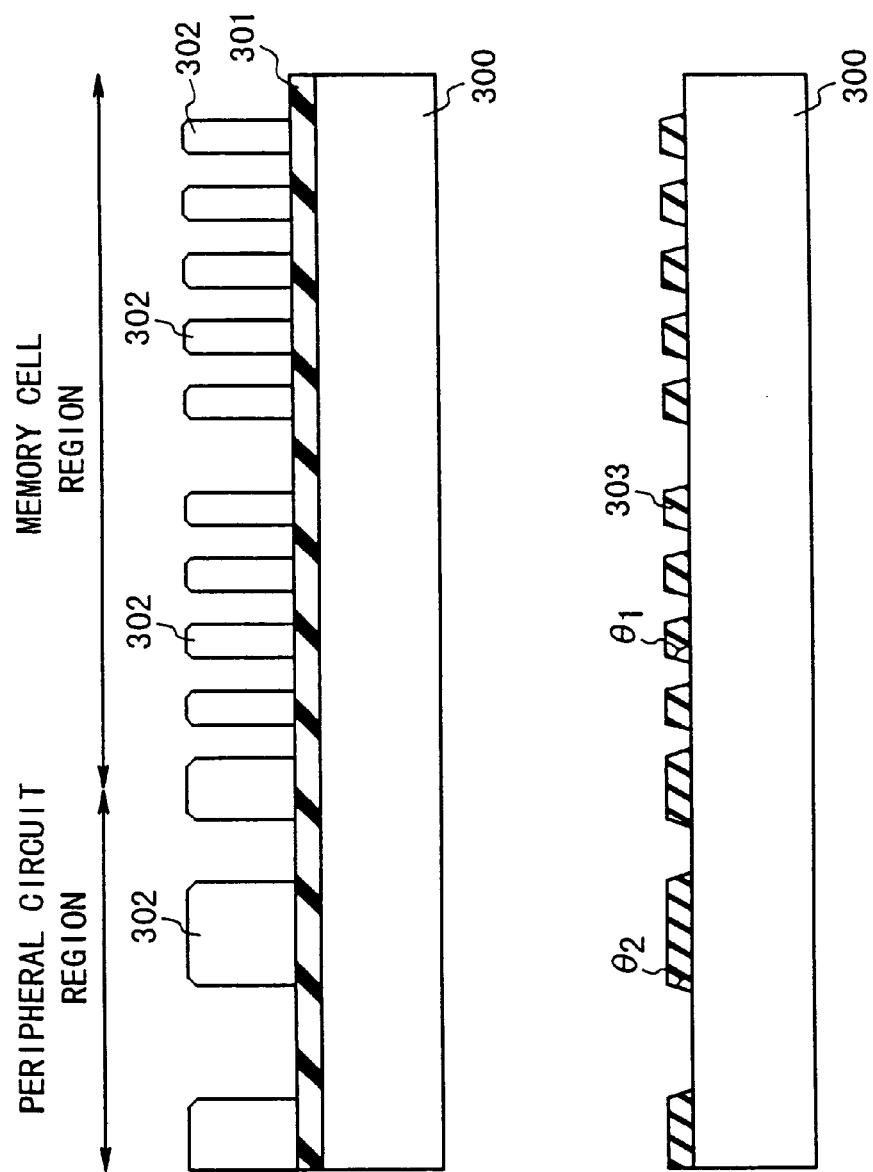
FIGS. 5A and 5B are cross sectional views illustrating a method of manufacturing a semiconductor device according to a third embodiment of the present invention.

Next, a method of manufacturing a semiconductor device according to the third embodiment of the present invention will be described below in detail with reference to FIGS. 5A and 5B. FIGS. 5A and 5B are cross sectional views illustrating a method of manufacturing a semiconductor device.

First, as shown in FIG. 5A, a silicon oxide film 301 is formed on the surface of a silicon substrate 300 by a CVD method or a thermal oxidation method. A photo-resist layer is formed on the silicon oxide film 301 and is patterned to have a pattern 302 covering isolation regions in the memory cell region and the peripheral circuit region by a photo-lithography method. Subsequently, a dry etching method is performed to the silicon oxide film 301 using the photo-resist pattern 302 as a mask.

At this time, a mixture gas of, for example, $CF_4$ and $CHF_3$ is flowed at a flow ratio of $CF_4/CHF_3=10/20$ under the pressure of 5 Pa, and a plasma is generated by applying high frequency power of 1000 W between parallel plate electrodes having the separation of 1.9 mm. In this case, it can be made possible that the isolation insulating films have an steep inclination angle ($\theta 1$) in the memory cell region having a narrow active region, and has a gentle inclination angle ($\theta 2$: $\theta 2<\theta 1$) in the peripheral circuit region having a wide active region, as shown in FIG. 5B.

For example, when the active region width of the memory cell is 0.4 $\mu$m, the result of $\theta 1=80$ to $82°$ has been obtained, and when the active region width of the peripheral circuit region is equal to or more than 1 $\mu$m, the result of $69°<\theta 2<75°$.

In the etching for forming a taper shape to an object being etched, it could be considered that products produced by reaction of the photo-resist and radicals in the plasma are deposited on the side walls of the object being etched to restrain the etching. Also, it could be described that that the more the deposition quantity of the products are, the larger the taper shape becomes. In the third embodiment, the large taper is formed in the peripheral circuit region, because a separation between the isolation insulating films in the peripheral circuit region is longer sufficiently than the mean free path of the products. However, the small taper is formed in the memory cell region, because a separation between the isolation insulating films in the memory cell region is long as much as the mean free path of the products, so that the deposition quantity of the products to the object is small.

In this way, the side taper shape of the isolation insulating film in the peripheral circuit region is gentler than that of the isolation insulating film in the memory cell region. Therefore, the remainder of the polysilicon film in the etching process can be made less in the peripheral circuit region.

Next, a method of manufacturing a semiconductor device according to the fourth embodiment of the present invention will be described below in detail with reference to FIGS. 6A to 6D. FIGS. 6A to 6D are cross sectional views illustrating a method of manufacturing a semiconductor device according to a fourth embodiment of the present invention.

Figure 6A:
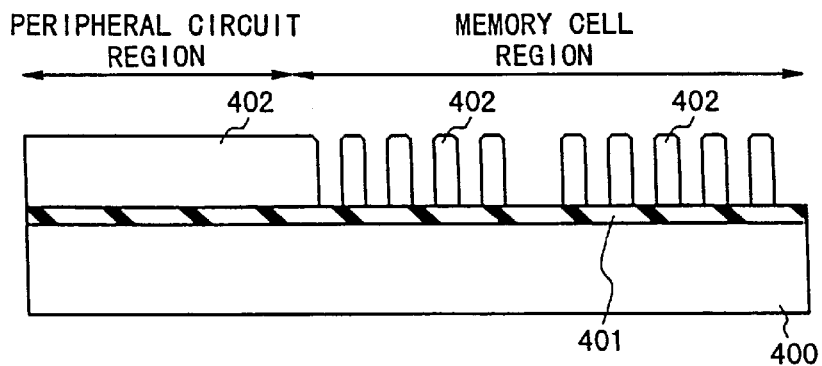
FIGS. 6A to 6D are cross sectional views illustrating a method of manufacturing a semiconductor device according to a fourth embodiment of the present invention.

First, as shown in FIG. 6A, a silicon oxide film layer 401 is formed on the surface of a silicon substrate 400 by a CVD method. Then, a photo-resist layer is formed and is patterned by a photo-lithography process to form a mask 402 covering isolation regions in the memory cell region and a peripheral circuit region.

Figure 6B:
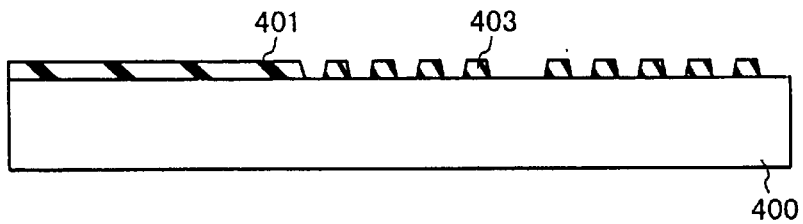

Next, as shown in FIG. 6B, the silicon oxide film 401 is exposed to a plasma ambience of a mixture gas of, for example, carbon tetra-fluoride ($CF_4$) and carbon dihydride difluoride ($CH_2F_2$), using the photo-resist mask 402. By this, the silicon oxide film layer 401 in the memory cell region is etched to form isolation insulating films 403 in the memory cell region (First dry etching). The etched side portion of each of the isolation insulation films 403 has an inclination angle of a taper shape. Subsequently, the photo-resist mask 402 is peeled off.

Figure 6C:
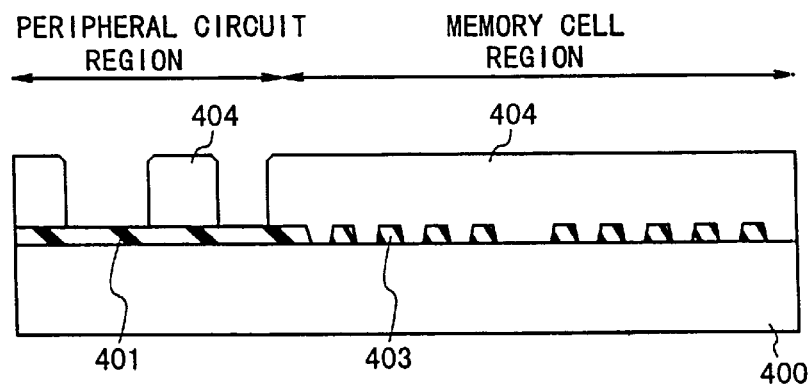

Further, as shown in FIG. 6C, a photo-resist is formed and patterned by the photo-lithography process to form a mask 404 covering isolation regions in the peripheral circuit region and the memory cell region.

Figure 6D:
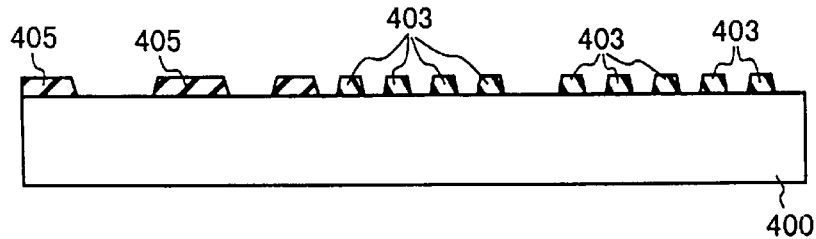

Next, as shown in FIG. 6D, the silicon oxide film layer 401 in the peripheral circuit region is exposed to a plasma ambience of the mixture gas of, for example, $CF_4$ and $CH_2F_2$, using the photo-resist mask 404. By this, the silicon oxide film 401 is etched to have a taper (Second dry etching). Subsequently, the photo-resist mask 404 is peeled off, and isolation oxide films 405 having a taper section on the side are formed in the peripheral circuit region.

The conventional isolation oxide films are formed by etching the silicon oxide film vertically and then by forming the side wall silicon oxide films, as described with reference to FIGS. 1A to 1E. On the other hand, the isolation oxide films formed in this embodiment have a gentler taper shape than the conventional isolation oxide film. Also, remainder produced when an upper structure is etched can be reduced.

Further, the etching conditions are switched between the first dry etching process in which the isolation oxide films are formed in the memory cell region, and the second dry etching process in which the isolation oxide films are formed in the peripheral circuit region. As a result, the taper shape of the side section of the isolation oxide film in the peripheral circuit region can be made gentler, compared with that of the side section of the isolation oxide film in the memory cell region.

For example, the pressure when the plasma is generated from the mixture gas of $CF_4$ and $CH_2F_2$ is set to 20 mTorr in the first dry etching process, and is set to 5 mTorr in the second dry etching process. In this case, it can be made possible to process the isolation oxide film to have a steep inclination angle (θ1) in the memory cell region and to a gentle inclination angle (θ2: θ2<θ1) in the peripheral circuit region.

When the active region width is 0.5 to 2 μm, the inclination angle (θ1) formed in the first dry etching process is 80 to 90°, and the inclination angle (θ2) formed in the second dry etching process is 60 to 80°.

As described above, in case of the first and second dry etching processes, it could be considered that the products produced by reaction of the photo-resist and radicals in the plasma are deposited on the side section of an object so that the etching is restrained. As a result, the object has the tapered side section. Also, it could be understood that a large amount of products are deposited on the side section of the object in the second dry etching process so as to easily form the taper shape, because the mean free path of the product becomes sufficiently longer than a separation between the isolation oxide films when the pressure is decreased.

The feature in this embodiment is in that even if the design size of the isolation region in the peripheral circuit region is as severe as the design size of the isolation region in the memory cell region, because the isolation insulating films are separately formed in the memory cell region and the peripheral circuit region, the taper of the side section of the isolation insulating film in the peripheral circuit region can be taken largely without influence of the design size.

In the third and fourth embodiments, the mixture gas of $CF_4$ and $CHF_3$, or the mixing gas of $CF_4$ and $CH_2F_2$ is used as the reaction gas in the dry etching to form the isolation oxide films. However, in almost all of the gases which are used to etch the silicon oxide film in a plasma state, an etching condition can be found to make the side wall of the silicon oxide film have the taper shape. The most widely used reaction gas is the mixture gas of a two or more of $CF_4$, $CHF_3$, $CH_2F_2$, $C_4F_8$, CO, $SF_6$ and Ar.

In any mixture gas, by optimizing a process parameter such as a pressure, a mixture gas flow rate, a mixture ratio, a plasma generating voltage and so on, it is made possible to etch the silicon oxide film for the side wall to have the taper shape.

In the above embodiments, the method of manufacturing the flash EEPROM as an example of the semiconductor memory device was described. However, the present invention is not limited to this. Also, various modifications are thought of in addition to the methods and the structure shown in the above embodiments.

Next, the method for manufacturing a semiconductor device according to a fifth embodiment of the present invention will be described below. FIGS. 14A to 14F are cross sectional views illustrating the method of manufacturing a semiconductor device in the fifth embodiment.

Figure 14A:
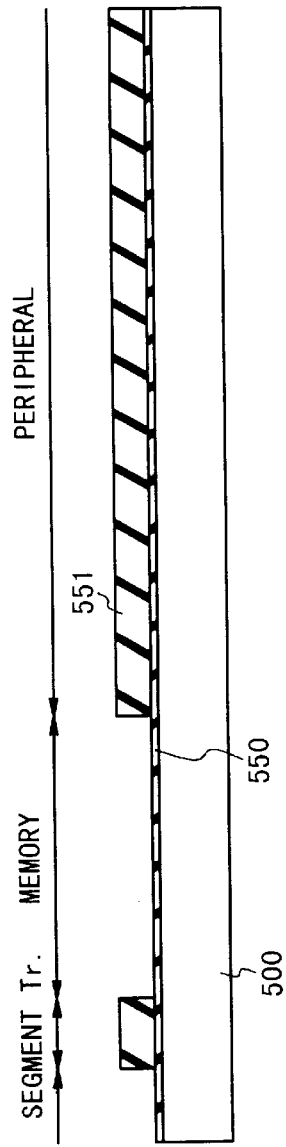
FIGS. 14A to 14F are cross sectional views illustrating a method of manufacturing a semiconductor device according to a fifth embodiment of the present invention.

First, referring to FIG. 14A, a silicon oxide film 550 and a silicon nitride film 551 are formed on a silicon substrate 500 in this order by a CVD method to have the film thicknesses of 50 nm and 140 nm, respectively. Then, the silicon nitride film 551 is removed from the memory cell region other than a region for a segment transistor.

Figure 14B:
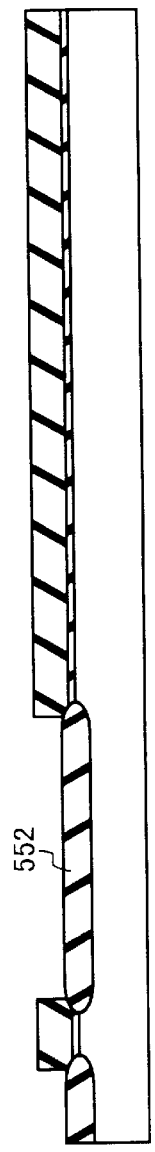

Next, as shown in FIG. 14B, thermal oxidation is performed to form a thick oxide film of 600 nm on the region from which the silicon nitride film 551 is removed.

Figure 14C:
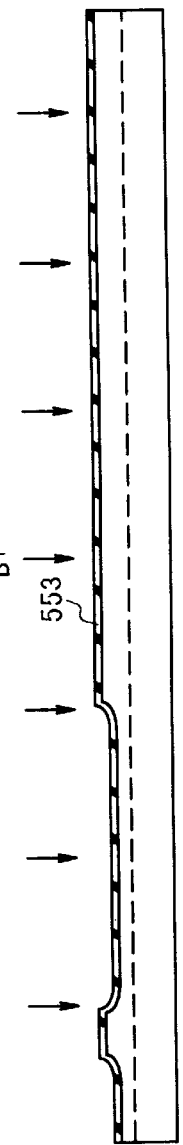

Next, as shown in FIG. 14C, the silicon nitride film 551 and the silicon oxide films 550 and 552 are removed. Then, a silicon oxide film 553 is formed by a thermal oxidation method to have the film thickness of 50 nm. Subsequently, boron ions are implanted on the whole surface with the condition of the implantation energy of 50 KeV and a dose amount of $6 \times 10^{12}$ $cm^{-2}$.

Figure 14D:
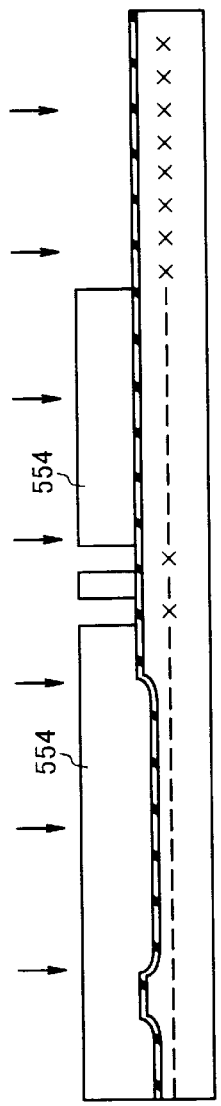

Next, as shown in FIG. 14D, a photo-resist layer 554 is formed on the whole surface and selectively removed from a region where phosphorous ions are implanted. Subsequently, phosphorous ions are implanted with the condition of the implantation energy of 100 KeV and a dose amount of $6 \times 10^{12}$ $cm^{-2}$ using the patterned photo-resist as a mask.

Figure 14E:
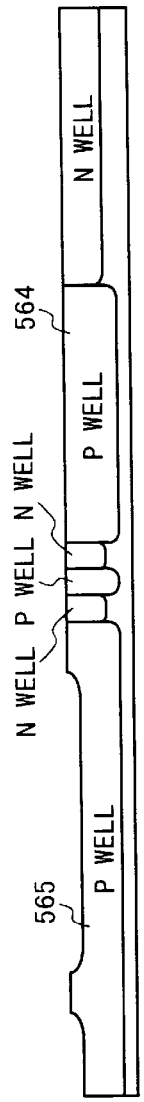

Next, as shown in FIG. 14E, the photo-resist layer 554 and the silicon oxide film 553 are removed. In this case, the regions of N wells 561 and 562 and P well 563 are a region for a high breakdown voltage transistor to be formed. The P well region 564 is a region for a P-channel transistor to be formed and the P well region 565 is a region for a memory cell transistor to be formed.

Figure 14F:
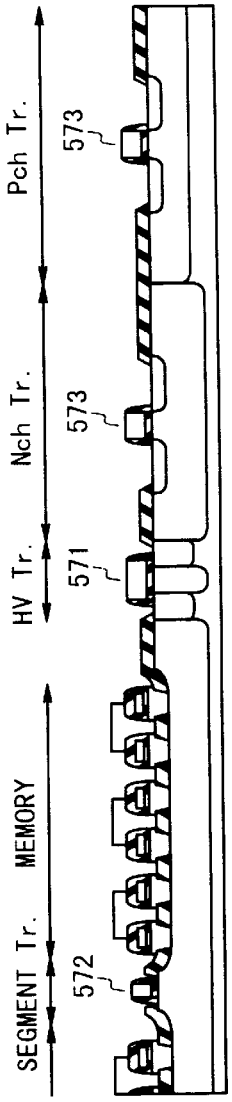

Subsequently, a silicon oxide film is formed by a CVD method to have the film thickness of 100 to 400 nm and then the memory cells and peripheral circuit are formed in accordance with the manufacturing method of the first, second or third embodiment. As a result, the semiconductor device shown in FIG. 14F is formed. In this case, the high breakdown transistor 571 and a segment transistor 572 are formed at the same time as a transistor 573 in the peripheral circuit region. When a memory cell array is divided into a plurality of cell regions, the segment transistor 572 is used to control the divided cell region. Therefore, the segment transistor is not necessary where the memory cell array is not divided.

According to the present embodiment, the memory cell region is located in a lower position than the peripheral circuit region and the region of the high breakdown transistor and the segment transistor to be formed. Therefore, a step between the memory cell transistor in the memory cell region and the transistors in the peripheral circuit region and the region of the high breakdown transistor and the segment transistor to be formed can be reduced. As a result, there can be eliminated the problem in a pattern displacement due to unevenness of a photo-resist film and displacement of focusing depth.

As described above, according to the present invention, the margin of the process condition can be made wide in case of the etching process of a thin film such as the polysilicon film formed on the upper part of the isolation region. Also, the remainders and the damage of the underlayer can be greatly reduced, resulting in improvement of the production yield. In addition, further, the element characteristic can be improved, resulting in the semiconductor device with high reliability.

What is claimed is:

1. A method of manufacturing a semiconductor device, comprising the steps of:
    forming an insulating film on a semiconductor substrate;
    performing a first formation of a first mask on said insulating film in a first region;
    performing a first removal of said insulating film using said first mask for isolation insulating films in said first region, wherein an element to be formed in said first region has a first active region;
    performing a second formation of a second mask on said insulating film in a second region, said second mask being different from said first mask; and
    performing a second removal of said insulating film using said second mask for isolation insulating films in said second region, wherein a first element to be formed in said first region has a first active region narrower than a second active region of a second element to be formed in said second region.

2. A method according to claim 1, wherein said step of performing a second removal is performed after said step of performing a first removal.

3. A method according to claim 2, wherein said step of performing a second removal and said step of performing a first removal are performed using a dry etching method.

4. A method according to claim 3, wherein an etching gas is a mixture gas of at least two of $CF_4$, $CHF_3$, $CH_2F_2$, $C_4F_8$, CO, $SF_6$ and Ar.

5. A method according to claim 4, wherein said step of performing said first removal and said step of performing said second removal each includes adjusting of etching conditions such as a pressure, a mixture gas flow rate, a mixture ratio of said at least two gases, and a plasma generation voltage.

6. A method according to claim 5, wherein a first pressure in said step of performing said first removal is lower than a second pressure in said step of performing said second removal.

7. A method according to claim 2, wherein said step of performing a first removal includes forming said isolation insulating films in said first region to have a taper of a first angle range, and
    wherein said step of performing a second removal includes forming said isolation insulating films in said second region to have a taper of a second angle range which is smaller than said first angle range.

8. A method according to claim 7, wherein said first angle range is 80 to 90 degrees and said second angle range is 60 to 80 degrees.

9. A method according to claim 2, wherein said isolation insulating films in said second region are higher than said isolation insulating films in said first region.

10. A method according to claim 9, further comprising the step of forming another insulating film on said insulating film before said step of performing a second removal.

11. A method according to claim 10, wherein said step of forming another insulating film is formed during a formation of said first element.

12. A method according to claim 1, further comprising the step of digging a surface of the semiconductor substrate for said first region before said step of forming an insulating film.

13. A method of manufacturing a semiconductor device, comprising the steps of:
    forming an insulating film on a semiconductor substrate;
    forming isolation insulating films in first and second regions from said insulating film such that said isolation insulating film in said first region has a taper portion of a first angle steeper than a second angle of a taper portion of said isolation insulating film in said second region, wherein a first element to be formed in said first region has a first active region narrower than a second active region of a second element to be formed in said second region;
    forming said first element between said isolation insulating films in said first region; and
    forming said second element between said isolation insulating films in said second region.

14. A method according to claim 13, wherein said step of forming isolation insulating films includes:
    forming a mask on said insulating film; and
    removing said insulating film using said mask by a dry etching method which uses a mixture etching gas.

15. A method according to claim 14, wherein said mixture etching gas is a mixture gas of at least two of $CF_4$, $CHF_3$, $CH_2F_2$, $C_4F_8$, CO, $SF_6$ and Ar.

16. A method according to claim 15, wherein said removing step includes adjusting of an etching condition such as a pressure, a mixture gas flow rate, a mixture ratio of said at least two gases, and a plasma generation voltage.

17. A method according to claim 13, wherein said first angle is in a range of 80 to 90 degrees and said second range is in a range of 60 to 80 degrees.

18. A method according to claim 13, wherein said isolation insulating films in said second region are formed during said step of forming said first element.

19. A method according to claim 13, further comprising the step of digging a surface of the semiconductor substrate for said first region before said step of forming an insulating film.

* * * * *